US012757418B2

(12) United States Patent
Chung et al.

(10) Patent No.: US 12,757,418 B2
(45) Date of Patent: Oct. 6, 2026

(54) CALABASH-SHAPED MIM CAPACITOR STRUCTURE AND FABRICATING METHOD OF THE SAME

(71) Applicant: UNITED MICROELECTRONICS CORP., Hsin-Chu City (TW)

(72) Inventors: Yao-Hsien Chung, Tainan City (TW); Fu-Yu Tsai, Tainan City (TW); Bin-Siang Tsai, Changhua County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 351 days.

(21) Appl. No.: 18/430,620

(22) Filed: Feb. 1, 2024

(65) Prior Publication Data

US 2025/0234569 A1 Jul. 17, 2025

(30) Foreign Application Priority Data

Jan. 11, 2024 (CN) ........................ 202410043939.X

(51) Int. Cl.

| | |
|---|---|
| ***H10D 1/68*** | (2025.01) |
| ***H10P 50/64*** | (2026.01) |
| ***H10W 20/00*** | (2026.01) |

(52) U.S. Cl.
CPC ........... *H10D 1/684* (2025.01); *H10P 50/642* (2026.01); *H10W 20/089* (2026.01)

(58) Field of Classification Search
None
See application file for complete search history.

(56) References Cited

U.S. PATENT DOCUMENTS

| | | | | |
|---|---|---|---|---|
| 10,211,146 B2 | 2/2019 | He | | |
| 10,388,721 B2 | 8/2019 | Adusumilli | | |
| 2012/0199949 A1* | 8/2012 | Lan | ........................ | H10D 1/711 438/386 |
| 2020/0135845 A1* | 4/2020 | Seidel | .................... | H10D 1/042 |
| 2024/0047513 A1* | 2/2024 | Su | .......................... | H10D 1/042 |

* cited by examiner

*Primary Examiner* — Nilufa Rahim
(74) *Attorney, Agent, or Firm* — Winston Hsu

(57) ABSTRACT

A calabash-shaped MIM capacitor structure includes a stacked layer. The stacked layer includes numerous dielectric layers. An MIM capacitor is disposed within the stacked layer. The MIM capacitor includes a calabash-shaped profile. The calabash-shaped profile includes a rounded bottom, a narrow body and a rounded shoulder disposed from bottom to top.

10 Claims, 8 Drawing Sheets

CALABASH-SHAPED MIM CAPACITOR STRUCTURE AND FABRICATING METHOD OF THE SAME

BACKGROUND OF THE INVENTION

1. Field of the Invention

The present invention relates to a metal-insulator-metal (MIM) capacitor, in particular to a calabash-shaped MIM capacitor.

2. Description of the Prior Art

MIM capacitors are not only used to filter noise in radio frequency circuits, or as load components in digital circuits, it is also widely used in general integrated circuit and circuit board manufacturing processes. In recent years, with the development of semiconductor integrated circuit process technology, the minimum width of devices on semiconductor substrates has gradually become smaller; therefore the density of integrated circuits per unit area is increased.

Due to the increase in the density of memory cell, the space occupied by a capacitor per unit area for charge storage will become smaller. Therefore, it is necessary to develop capacitors with small size but high capacitance. Currently, how to form MIM capacitors with higher capacitance under high density has become a goal for semiconductor field.

SUMMARY OF THE INVENTION

In view of this, the present invention provides a calabash-shaped MIM capacitor structure and a fabricating method of the same to form an MIM capacitor with high capacitance.

According to a preferred embodiment of the present invention, a calabash-shaped MIM capacitor structure includes a stacked layer, wherein the stacked layer includes numerous dielectric layers. An MIM capacitor is disposed within the stacked layer, wherein the MIM capacitor includes a calabash-shaped profile, and the calabash-shaped profile includes a rounded bottom, a narrow body and a rounded shoulder disposed from bottom to top.

According to another preferred embodiment of the present invention, a fabricating method of a calabash-shaped MIM capacitor structure includes providing a first nitrogen-containing silicon layer, a first oxygen-containing silicon layer, a second nitrogen-containing silicon layer and a second oxygen-containing silicon layer disposed in sequence from bottom to top. Then, a first etching is performed to etch the second oxygen-containing silicon layer, the second nitrogen-containing silicon layer, the first oxygen-containing silicon layer and the first nitrogen-containing silicon layer to form a trench. Later, a second etching is performed to etch the second oxygen-containing silicon layer and the first oxygen-containing silicon layer to laterally expand a portion of the trench to form a calabash-shaped trench. Finally, an MIM capacitor is formed to fill in the calabash-shaped trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of a calabash-shaped MIM capacitor structure according to a preferred embodiment of the present invention, wherein:

FIG. 1 depicts a stack layer;

FIG. 2 is a fabricating stage in continuous of FIG. 1;

FIG. 3 is a fabricating stage in continuous of FIG. 2;

FIG. 4 is a fabricating stage in continuous of FIG. 3;

FIG. 5 is a fabricating stage in continuous of FIG. 4; and

FIG. 6 is a fabricating stage in continuous of FIG. 5.

DETAILED DESCRIPTION

FIG. 1 to FIG. 6 depict a fabricating method of a calabash-shaped MIM capacitor structure according to a preferred embodiment of the present invention.

Figure 1:
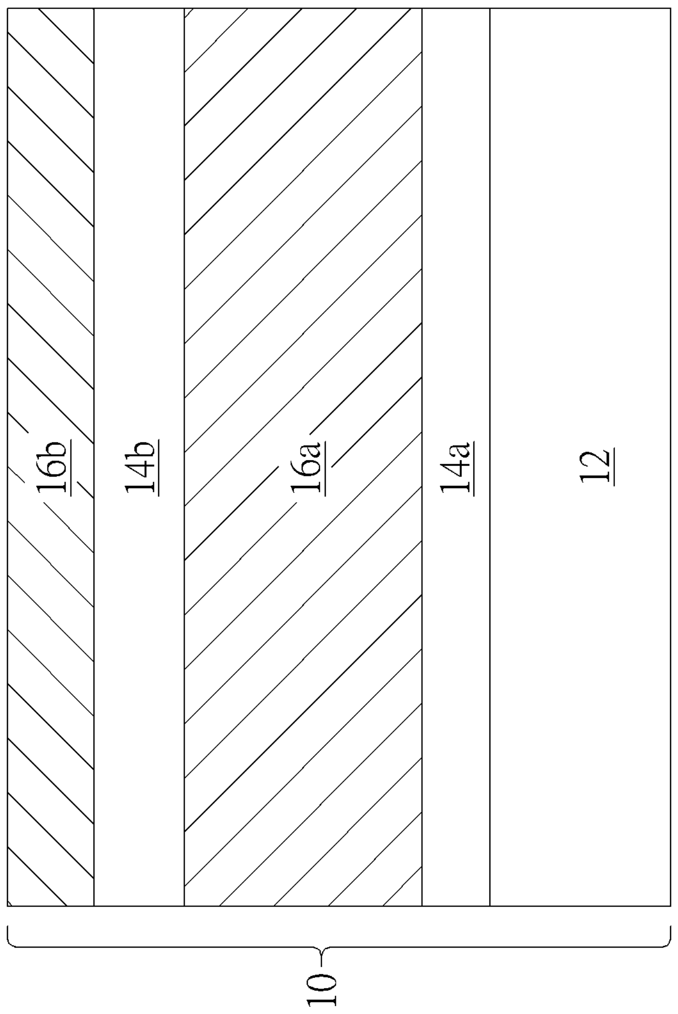

As shown in FIG. 1, a stacked layer 10 is provided. The stacked layer 10 includes numerous dielectric layers such as a silicon oxide layer 12, a first nitrogen-containing silicon layer 14*a*, a first oxygen-containing silicon layer 16*a*, a second nitrogen-containing silicon layer 14*b* and a second oxygen-containing silicon layer 16*b* arranged from bottom to top in sequence. The number of dielectric layers can be adjusted according to different requirements, and the type of dielectric layers can also be changed. However, materials of adjacent dielectric layers need to have different etching selectivity ratios with respective to the same etchant.

Figure 2:
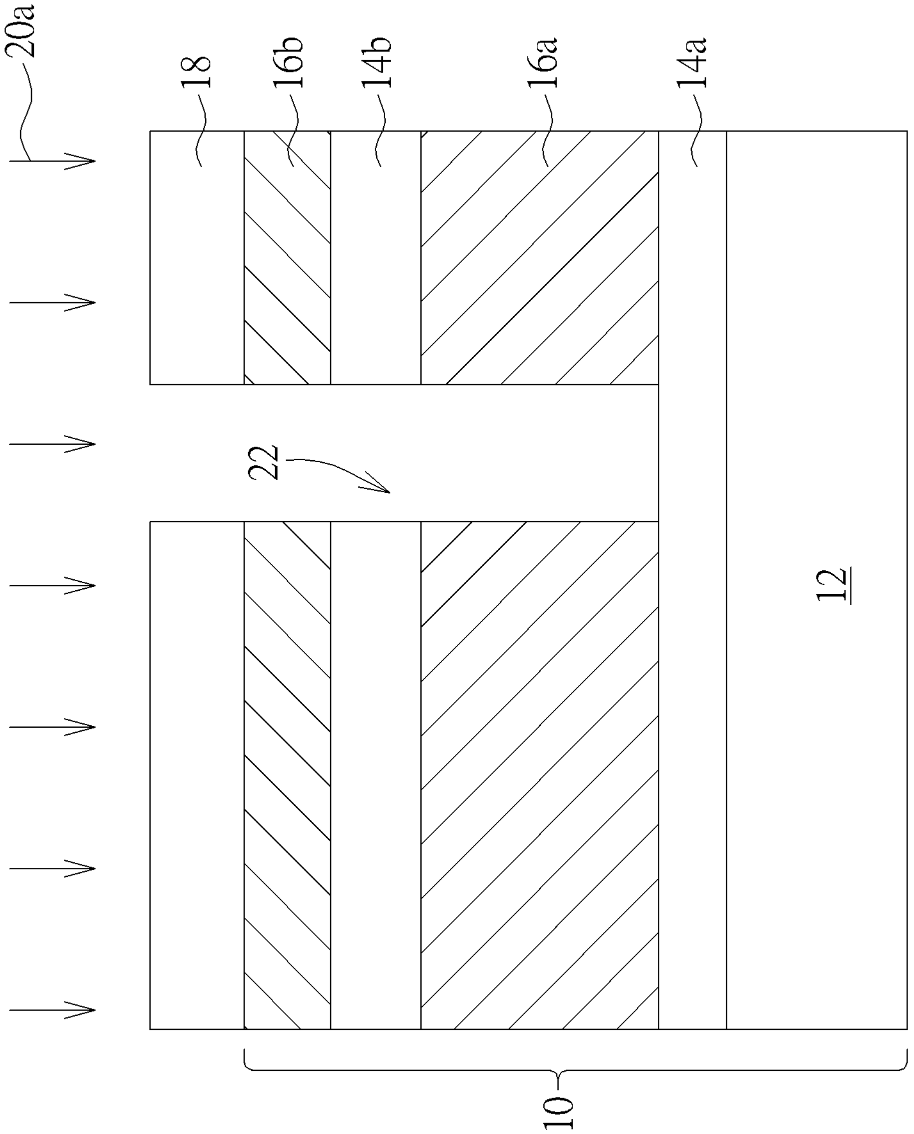

As shown in FIG. 2, a patterned photoresist 18 is formed to cover the stacked layer 10. Then, a first etching 20*a* is performed to etch the second oxygen-containing silicon layer 16*b*, the second nitrogen-containing silicon layer 14*b*, and the first oxygen-containing silicon layer 16*a* by using the patterned photoresist 18 as a mask to form a trench 22 in the second oxygen-containing silicon layer 16*b*, the second nitrogen-containing silicon layer 14*b* and the first oxygen-containing silicon layer 16*a*. The trench 22 takes the first nitrogen-containing silicide layer 14*a* as a bottom. In addition, the sidewalls of the trench 22 are perpendicular to the top surface of the stacked layer 10. The sidewalls of the trench 22 in the second oxygen-containing silicon layer 16*b*, in the second nitrogen-containing silicon layer 14*b*, and in the first oxygen-containing silicon layer 16*a* are aligned with each other. The first etching 20*a* is preferably a dry etching.

Figure 3:
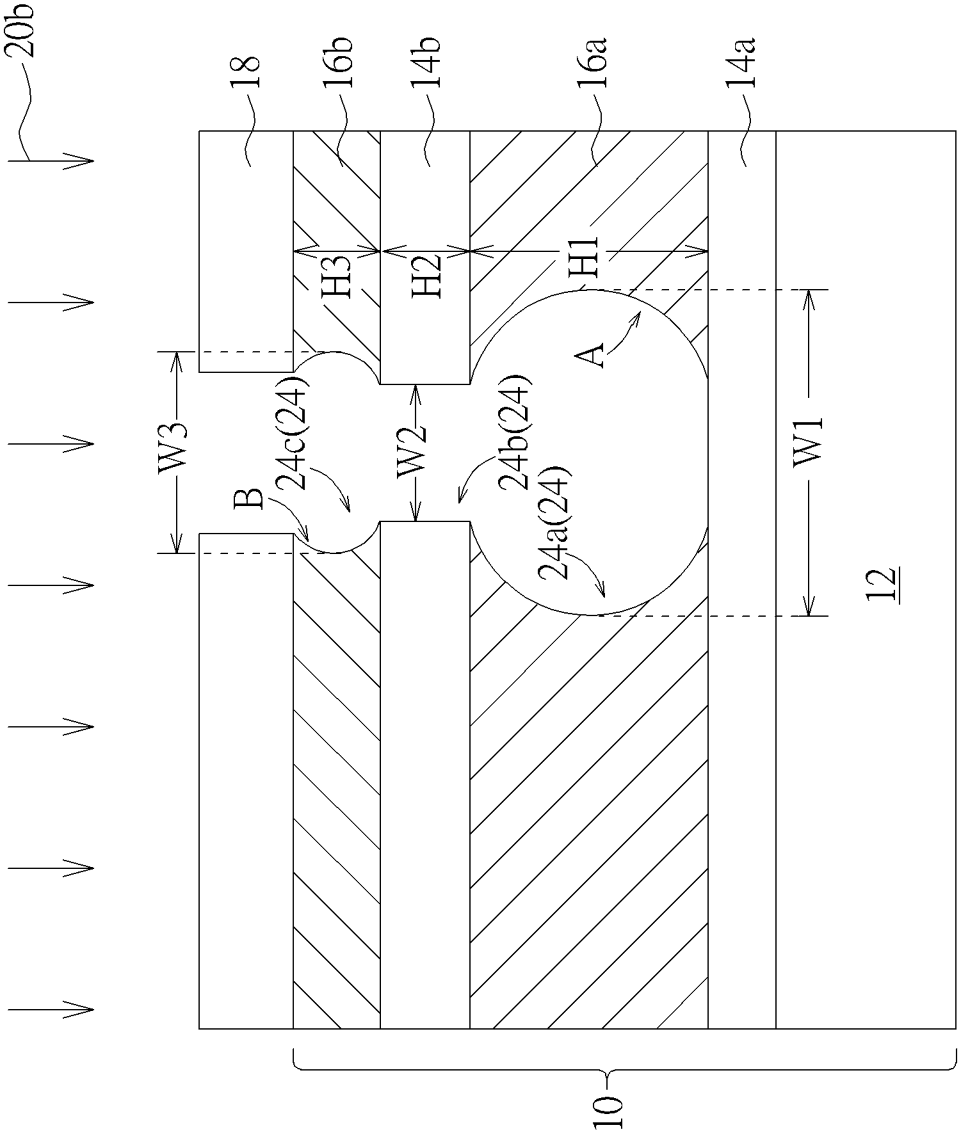

As shown in FIG. 3, a second etching 20*b* is performed to etch the second oxygen-containing silicon layer 16*b* and the first oxygen-containing silicon layer 16*a* to laterally expand part of the trench 22 to form a calabash-shaped trench 24. The second etching 20*b* includes a wet etching or a chemical oxide removal (COR) etching. In details, the second etching 20*b* selectively etches silicon oxide, therefore, while the second oxygen-containing silicon layer 16*b* and the first oxygen-containing silicon layer 16*a* are etched, the surfaces of the second nitrogen-containing silicon layer 14*b* and the first nitrogen-containing silicon layer 14*a* are not etched. The wet etching can utilize dilute hydrofluoric acid as an etchant. Please also refer to FIG. 2. When performing the second etching 20*b*, the trench 22 in the second oxygen-containing silicon layer 16*b* is etched to laterally expand to form a rounded shoulder 24*c*, the trench 22 in the first oxygen-containing silicon layer 16*a* is also etched to laterally expand to form a rounded bottom 24*a*, and the trench 22 in the second nitrogen-containing silicon layer 14*b* can be seen as not being etched. Therefore, the trench 22 in the second nitrogen-containing silicon layer 14*b* still has a sidewall perpendicular to the top surface of the stacked layer 10, and the trench 22 in the second nitrogen-containing silicon layer 14*b* is defined as a narrow body 24*b*. That is, the calabash-shaped 24 includes a rounded bottom 24*a*, a narrow body 24*b* and a rounded shoulder 24*c* disposed in sequence from bottom to top and connected to each other. The rounded bottom 24*a* preferably has the first nitrogen-containing silicon layer 14*a* as its bottom; therefore the first nitrogen-containing silicon layer 14*a* is exposed through the calabash-shaped trench 24. The above-mentioned lateral expansion refers to an expansion in a direction parallel to the top surface of the second oxygen-containing silicon layer 16*b*.

The maximum width W1 of the rounded bottom 24*a* is greater than the width W2 of the narrow body 22*b*, and the maximum width W3 of the rounded shoulder 24*c* is greater than the width W2 of the narrow body 24*b*. The maximum width W1 of the rounded bottom 24*a* is preferably greater than the maximum width W3 of the rounded shoulder 24*c*. The height H1 of the rounded bottom 24*a* is greater than the height H2 of the narrow body 24*b*, and the height H1 of the rounded bottom 24*a* is greater than the height H3 of the rounded shoulder 24*c*. The rounded bottom 24*a* includes two first rounded sidewalls A respectively concaving toward the first oxygen-containing silicon layer 16*a*, and the rounded shoulder 24*c* includes two second rounded sidewalls B respectively concaving toward the second oxygen-containing silicon layer 16*b*.

Figure 4:
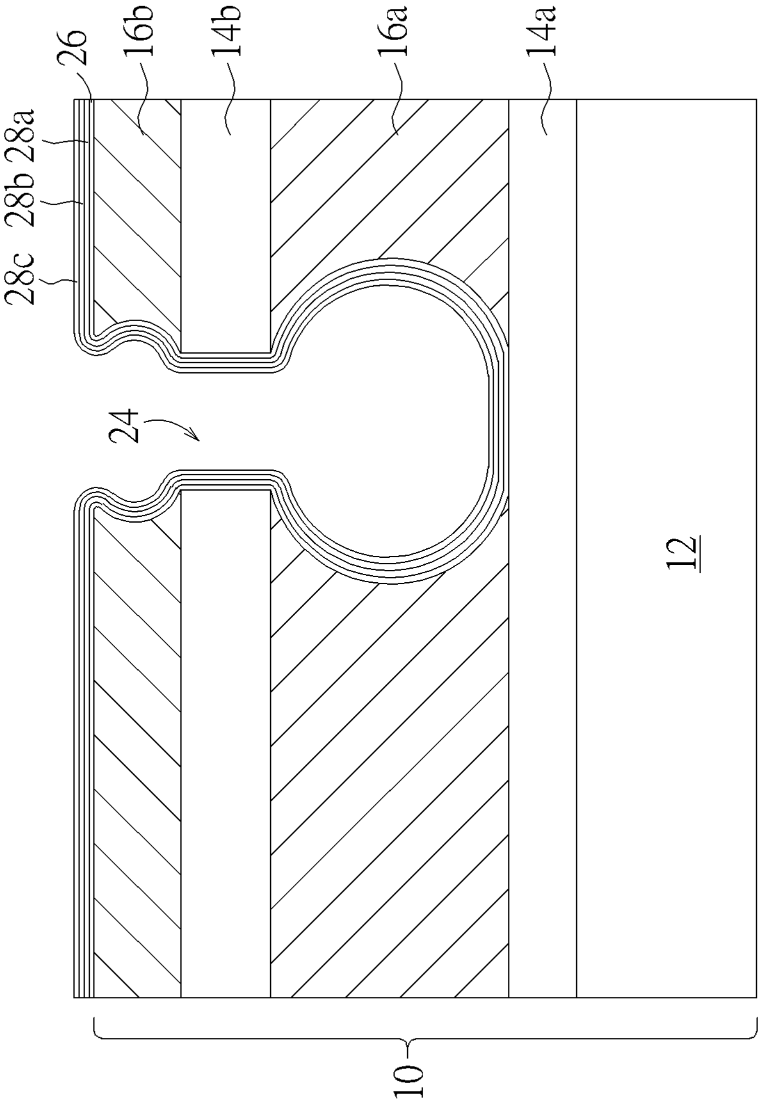
Figure 5:
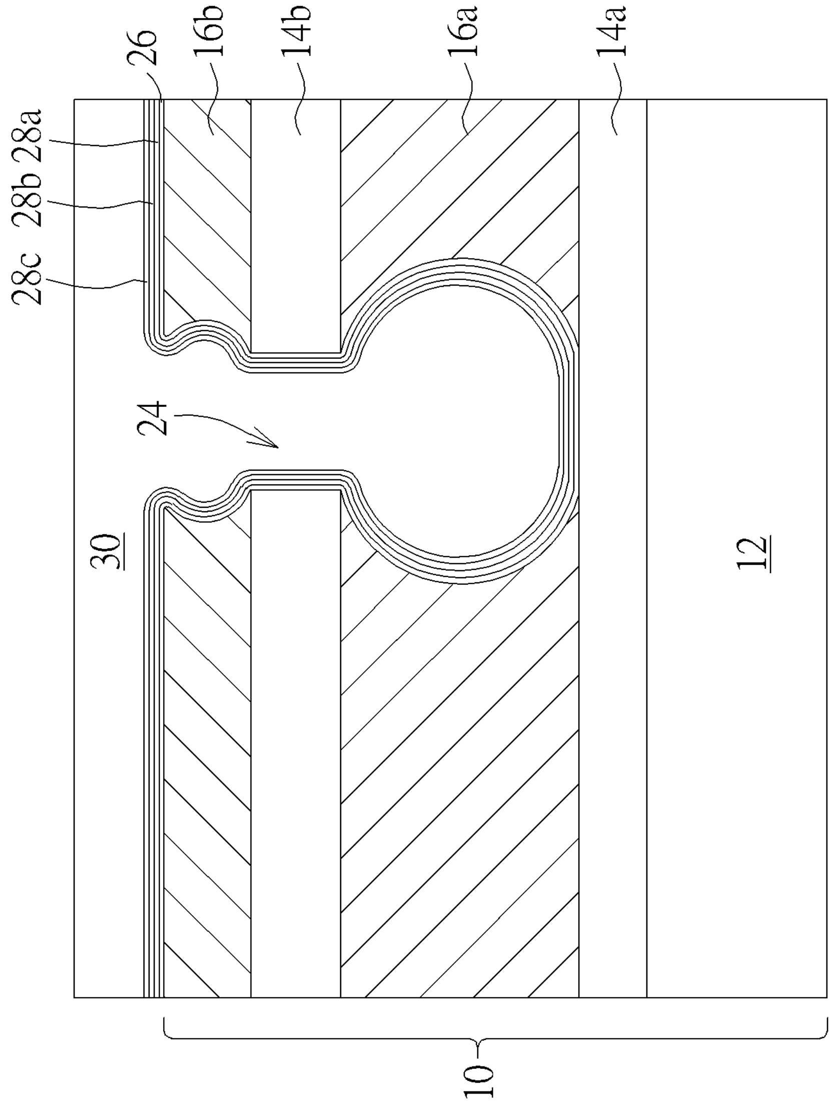
Figure 6:
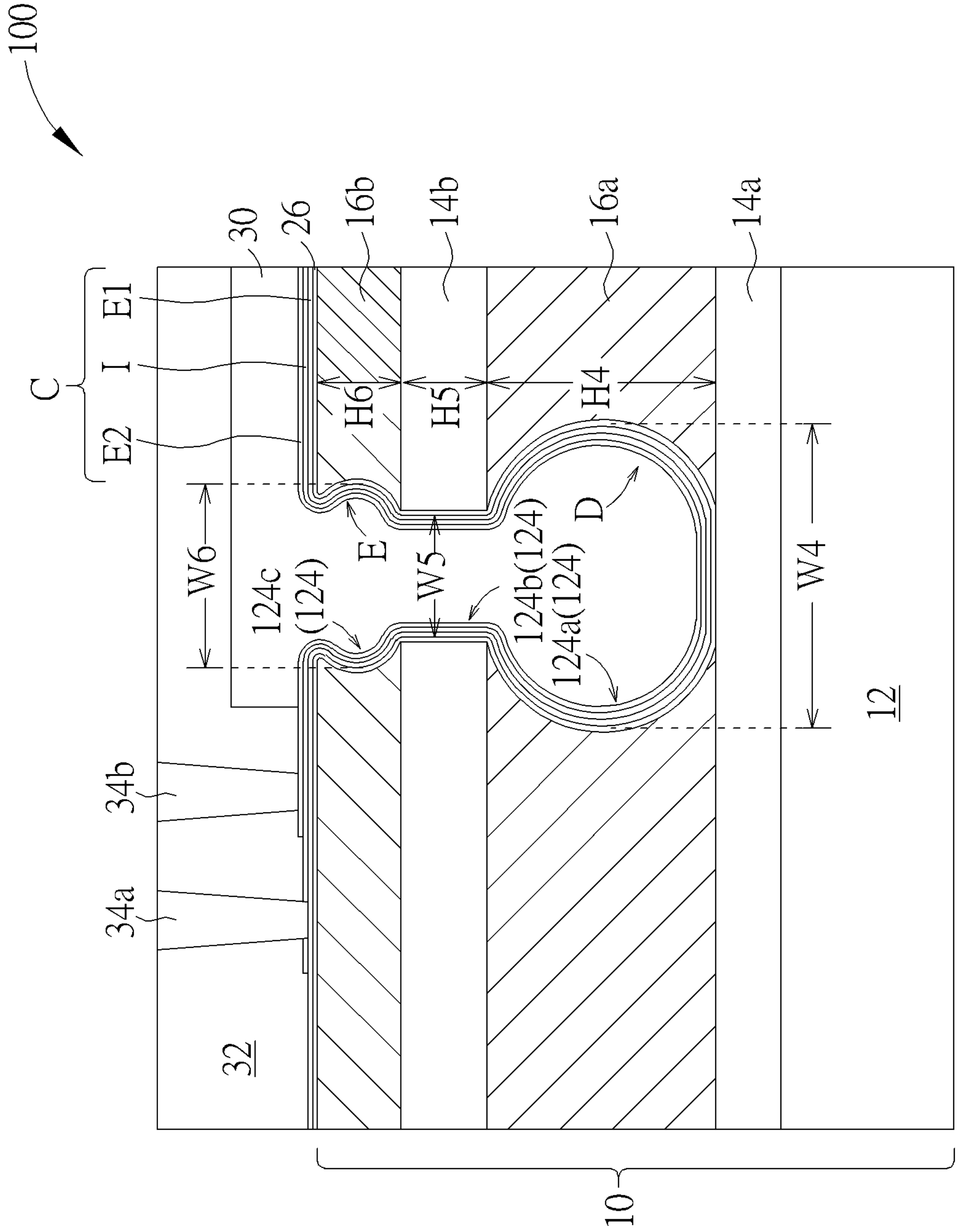

As shown in FIG. 4, the patterned photoresist 18 is removed. Next, a silicon oxide lining layer 26 is formed to cover the calabash-shaped trench 24 and the top surface of the second oxygen-containing silicon layer 16*b*. After that, a first conductive layer 28*a*, an insulating layer 28*b* and a second conductive layer 28*c* are sequentially formed to cover the calabash-shaped trench 24 and the top surface of the second oxygen-containing silicon layer 16*b*. As shown in FIG. 5, an insulating layer 30 is formed to fill the calabash-shaped trench 24 and contact the second conductive layer 28*c*. The insulating layer 30 also covers the top surface of the second oxygen-containing silicon layer 16*b*. As shown in FIG. 5 and FIG. 6, part of the insulating layer 30, part of the second conductive layer 28*c*, part of the insulating layer 28*b* and part of the first conductive layer 28*a* are removed, so that the second conductive layer 28*c*, the insulating layer 28*b* and the silicon oxide lining layer 26 are exposed. Now, the remaining first conductive layer 28*a* becomes the first electrode E1, the remaining second conductive layer 28*c* becomes the second electrode E2, and the remaining insulating layer 28*b* becomes the capacitor dielectric layer l. The first electrode E1, the capacitor dielectric layer l and the second electrode E2 form a calabash-shaped MIM capacitor C of the present invention.

Then, a dielectric layer 32 is formed to cover the insulating layer 30, the second electrode E2, the capacitor dielectric layer l and the silicon oxide liner 26. The dielectric layer 32 can be made of silicon oxide, silicon nitride, silicon oxynitride or other materials. After that, a first conductive plug 34*a* is formed to penetrate the dielectric layer 32 and the capacitor dielectric layer l to contact the first electrode E1, and a second conductive plug 34*b* is formed to penetrate the dielectric layer 32 and contact the second electrode E2. At this point, a calabash-shaped MIM capacitor structure 100 of the present invention is completed.

As shown in FIG. 6, a calabash-shaped MIM capacitor structure 100 includes a stacked layer 10. The stacked layer 10 includes numerous dielectric layers. The stacked layer 10 can be disposed on a substrate (not shown). A transistor (not shown) can be disposed on the substrate, and the transistor contacts the substrate. The substrate can be a silicon substrate, a germanium substrate, a gallium arsenide substrate, a silicon germanium substrate, an indium phosphide substrate, a gallium nitride substrate, a silicon carbide substrate or a silicon-on-insulator substrate. An MIM capacitor C is disposed in the stacked layer 10. The MIM capacitor C includes a calabash-shaped profile 124. Specifically speaking, the MIM capacitor C forms a calabash-shaped profile 124. The calabash-shaped profile 124 includes a rounded bottom 124*a*, a narrow body 124*b* and a rounded shoulder 124*c* disposed from bottom to top in sequence. An insulating layer 30 is surrounded by the calabash-shaped profile 124 and disposed in the calabash-shaped profile 124. The insulating layer 30 is preferably silicon oxide. A silicon oxide liner 26 is disposed between the MIM capacitor C and the stack layer 10. The MIM capacitor C is composed of a first electrode E1, a capacitor dielectric layer l and a second electrode E2. The silicon oxide liner 26 contacts the first electrode E1 and the stacked layer 10. The first electrode E1 and the second electrode E2 independently include tantalum nitride, titanium nitride, tantalum or titanium. The capacitor dielectric layer l includes aluminum oxide, zirconium oxide, barium strontium titanate (BST), lead zirconate titanate (PZT), zirconium silicate ($ZrSiO_4$), hafnium silicon oxide ($HfSiO_2$), Hafnium silicon oxynitride (HfSiON), tantalum oxide or a combination of the above materials.

The stacked layer 10 can be form by a variety of different dielectric materials. For example, the stacked layer 10 may include a silicon oxide layer 12, a first nitrogen-containing silicon layer 14*a*, a first oxygen-containing silicon layer 16*a*, a second nitrogen-containing silicon layer 14*b* and a second oxygen-containing silicon layer 16*b* disposed in sequence from bottom to top. A material of the first nitrogen-containing silicon layer 14*a* is different from a material of the first oxygen-containing silicon layer 16*a*, the material of the first oxygen-containing silicon layer 16*a* is different from a material of the second nitrogen-containing silicon layer 14*b*, and the material of the second nitrogen-containing silicon layer 14*b* is different from a material of the second oxygen-containing silicon layer 16*b*. According to a preferred embodiment of the present invention, the first nitrogen-containing silicon layer 14*a* is silicon carbonitride. The first oxygen-containing silicon layer 16*a* is tetra-ethyl-ortho-silicate (TEOS). The second nitrogen-containing silicon layer 14*b* is silicon nitride, and the second oxygen-containing silicon layer 16*b* is silicon oxide. The number of dielectric layers can be adjusted according to different requirements, and the type of dielectric layers can also be changed. However, the materials of adjacent dielectric layers need to have different etching selectivity ratios for the same etchant. Types of dielectric layers include materials such as silicon nitride, silicon oxynitride, silicon nitride carbide, or silicon oxide.

In addition, the thickness of the first oxygen-containing silicon layer 16*a* is the largest among the stacked layers 10. According to a preferred embodiment of the present invention, the thickness of the first nitrogen-containing silicon layer 14*a* is 600 angstroms, the thickness of the first oxygen-containing silicon layer 16*a* is 5600 angstroms, the thickness of the second nitrogen-containing silicon layer 14*b* is 1700 angstroms, and the thickness of the second oxygen-containing silicon layer 16*b* is 50 angstroms.

In addition, the rounded bottom 124*a* is embedded in the first oxygen-containing silicon layer 16*a*, the narrow body 124*b* is embedded in the second nitrogen-containing silicon layer 14*b*, and the rounded shoulder 124*c* is embedded in the second oxygen-containing silicon layer 16*b*. The rounded bottom 124*a* includes two first rounded sidewalls D which concave into the stacked layer 10. In details, two ends of the first rounded sidewall D are respectively aligned with the top surface and the bottom surface of the first oxygen-containing silicon layer 16*a*. The entire first rounded sidewall D is in the first oxygen-containing silicon layer 16*a*. Because the thickness of the first oxygen-containing silicon layer 16*a* is the largest, the height H4 of the rounded bottom 124*a* is greater than the height H5 of the narrow body 124*b*. The height H4 of the rounded bottom 124*a* is greater than the height H6 of the rounded shoulder 124*c*.

The rounded shoulder 124*a* includes two second rounded sidewalls E which concave into the stacked layer 10. In details, two ends of each of the second rounded sidewall E are respectively aligned with the top surface and the bottom surface of the second oxygen-containing silicon layer 16*b*. Each of the second rounded sidewalls E is entirely in the second oxygen-containing silicon layer 16*b*. The maximum width W6 of the rounded shoulder 124*c* is preferably greater than the width W5 of the narrow body 124*b*. The maximum width W4 of the rounded bottom 124*a* is preferably greater than the width W5 of the narrow body 124*b*. The maximum width W4 of the rounded bottom 124*a* is preferably greater than the maximum width W6 of the rounded shoulder 124*c*.

The MIM capacitor C can extend from the rounded shoulder 124*c* to cover the top surface of the second oxygen-containing silicon layer 16*b*. Part of the capacitor dielectric layer l of the MIM capacitor C on the top surface of the second oxygen-containing silicon layer 16*b* is not covered by the second electrode E2. A first conductive plug 34*a* penetrates the capacitor dielectric layer l and contacts the first electrode E1, and a second conductive plug 34*b* contacts the second electrode E2.

Figure 7:
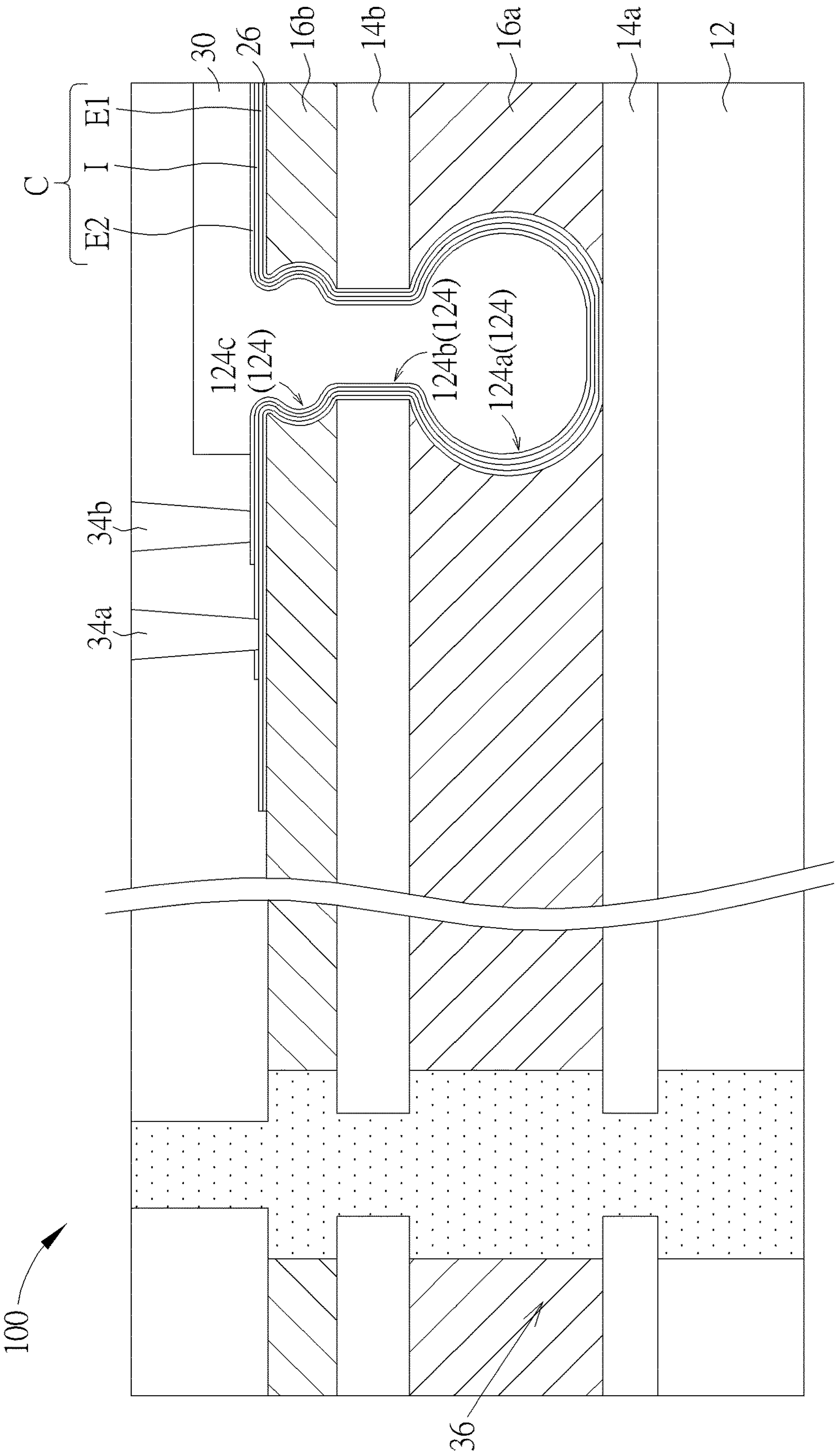
FIG. 7 depicts a calabash-shaped MIM capacitor structure and a dual damascene copper line.

In addition, the stacked layer 10 is preferably a dielectric layer formed in the process of the back end of line. Therefore, there are no transistors in the stacked layer 10, and there are no plugs which directly contacts the source and drain buried in the stacked layer 10. Furthermore, there are all metal lines with large widths embedded in the stacked layer 10. As shown in FIG. 7, at least a set of dual damascene copper lines 36 are embedded in the stacked layer 10 where the calabash-shaped MIM capacitor C embedded therein. In FIG. 7, elements which are substantially the same as those in the embodiment of FIG. 6 are denoted by the same reference numerals; an accompanying explanation is therefore omitted.

Figure 8:
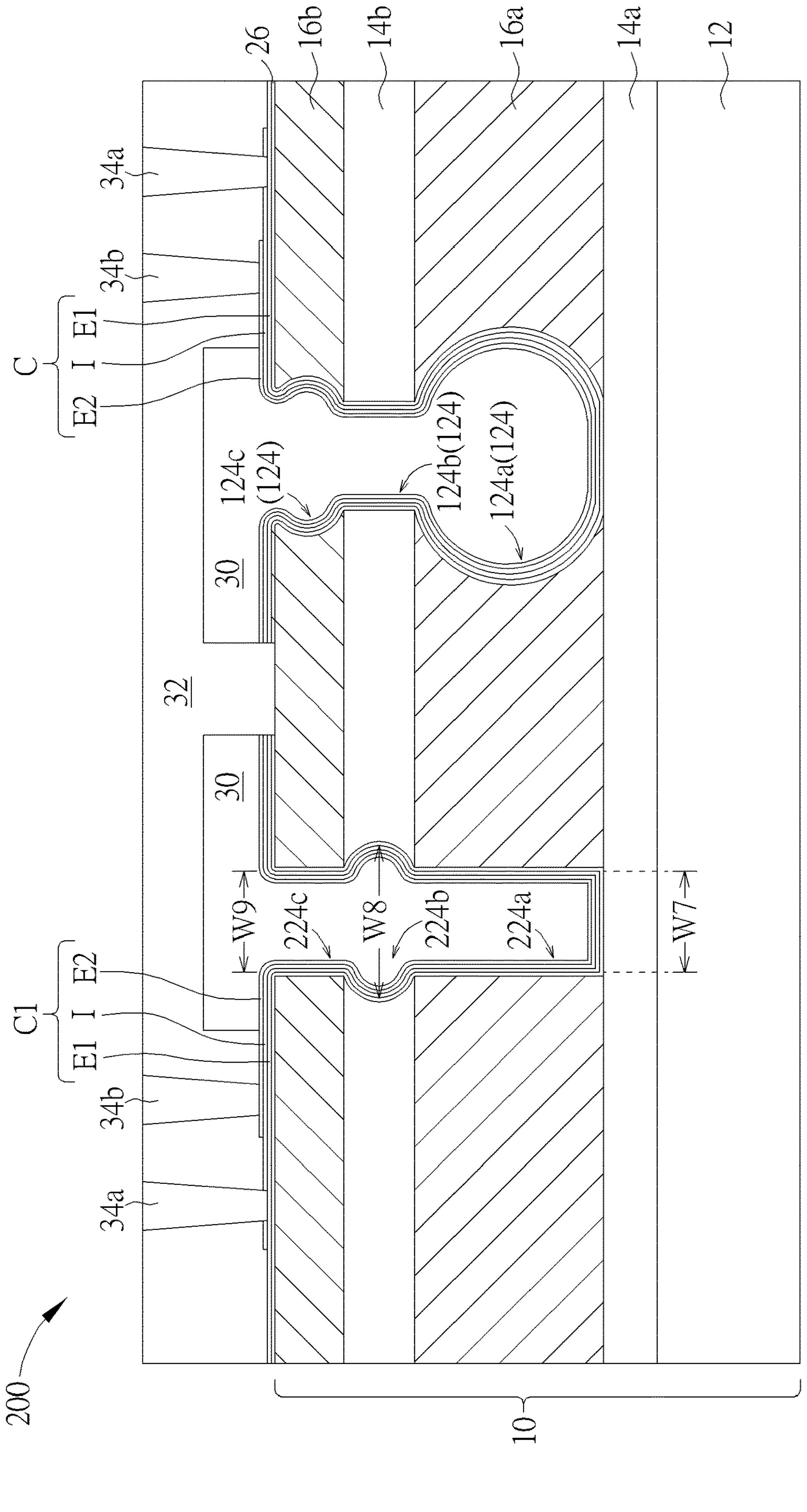
FIG. 8 depicts a calabash-shaped MIM capacitor structure according to another preferred embodiment of the present invention.

FIG. 8 depicts a calabash-shaped MIM capacitor structure according to another preferred embodiment of the present invention, wherein elements which are substantially the same as those in the embodiment of FIG. 6 are denoted by the same reference numerals; an accompanying explanation is therefore omitted.

As shown in FIG. 8, another MIM capacitor C1 is disposed on one side of the MIM capacitor C. The difference between the MIM capacitor C and the MIM capacitor C1 is that The MIM capacitor C1 includes a narrow bottom 224*a*, a rounded body 224*b* and a narrow shoulder 224*c* arranged from bottom to top. The narrow bottom 224*a* is located in the first oxygen-containing silicon layer 16*a*, the rounded body 224*b* is located in the second nitrogen-containing silicon layer 14*b*, and the narrow shoulder 224*c* is located in the second oxygen-containing silicon layer 16*b*. The maximum width W8 of the rounded body 224*b* is greater than the width W7 of the narrow bottom 224*a*. The width W8 of the rounded body 224*b* is greater than the width W9 of the narrow shoulder 224*c*. Therefore, the profile of the MIM capacitor C1 is complementary to the profile of the MIM capacitor C. In this way, the integrity of the capacitor can be increased. Moreover, operations of the MIM capacitor C1 and the MIM capacitor C are independent from each other. The manufacturing method of the MIM capacitor C1 may include forming two trenches 22 at the same time in the step of FIG. 2. During the second etching 20*b* in FIG. 3, only one of the trenches 22 is etched. Later, a third etching is performed. The third etching only etches the other trench 22. This third etching selectively etches silicon nitride. In this way, the middle portion of trench 22 can be widened. After that, the first electrode E1, the capacitor dielectric layer l and the second electrode E2 are formed according to the aforementioned steps, and the MIM capacitor C1 can be completed.

The present invention uses the second etching to laterally expand the trench in the stacked layer to form a calabash-shaped MIM capacitor. In this way, the surface area of the MIM capacitor can be increased and thereby the capacitance can also be raised.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calabash-shaped metal-insulator-metal (MIM) capacitor structure, comprising:

a stacked layer, wherein the stacked layer comprises a plurality of dielectric layers, and the plurality of dielectric layers comprises a first nitrogen-containing silicon layer, a first oxygen-containing silicon layer, a second nitrogen-containing silicon layer and a second oxygen-containing silicon layer disposed in sequence from bottom to top; and an MIM capacitor disposed within the stacked layer, wherein the MIM capacitor comprises a calabash-shaped the profile, and calabash-shaped profile comprises a rounded bottom, a narrow body and a rounded shoulder disposed from bottom to top in sequence, wherein the rounded bottom is embedded in the first oxygen-containing silicon layer, the narrow body is embedded in the second nitrogen-containing silicon layer, and the rounded shoulder is embedded in the second oxygen-containing silicon layer.

2. The calabash-shaped MIM capacitor structure of claim 1, wherein a maximum width of the rounded bottom is greater than a width of the narrow body.

3. The calabash-shaped MIM capacitor structure of claim 1, wherein a maximum width of the rounded shoulder is greater than a width of the narrow body.

4. The calabash-shaped MIM capacitor structure of claim 1, wherein a material of the first nitrogen-containing silicon layer is different from a material of the first oxygen-containing silicon the material of the first layer, oxygen-containing silicon layer is different from a material of the second nitrogen-containing silicon layer, and the material of the second nitrogen-containing silicon layer is different from a material of the second oxygen-containing silicon layer.

5. The calabash-shaped MIM capacitor structure of claim 1, wherein among the plurality of dielectric layers, a thickness of the first oxygen-containing silicon layer is the largest.

6. The calabash-shaped MIM capacitor structure of claim 1, wherein the MIM capacitor extends from the rounded shoulder to cover a top surface of the second oxygen-containing silicon layer.

7. The calabash-shaped MIM capacitor structure of claim 1, wherein a height of the rounded bottom is greater than a height of the narrow body, and the height of the rounded bottom is greater than a height of the rounded shoulder.

8. The calabash-shaped MIM capacitor structure of claim 1, further comprising a dual damascene copper line disposed in the stacked layer and at one side of the MIM capacitor.

9. The calabash-shaped MIM capacitor structure of claim 1, wherein there is no transistor in the stacked layer.

10. The calabash-shaped MIM capacitor structure of claim 1, wherein the rounded bottom comprises two first rounded sidewalls respectively concaving toward the stacked layer, and the rounded shoulder comprises two second rounded sidewalls respectively concaving toward the stacked layer.

* * * * *